(12) United States Patent
Gu-Stoppel et al.

(10) Patent No.: US 12,209,010 B2
(45) Date of Patent: Jan. 28, 2025

(54) MEMS AND METHOD OF MANUFACTURING THE SAME

(71) Applicant: Fraunhofer-Gesellschaft zur Förderung der angewandten Forschung e.V., Munich (DE)

(72) Inventors: Shanshan Gu-Stoppel, Itzehoe (DE); Malte Florian Niekiel, Itzehoe (DE); Thomas Lisec, Itzehoe (DE); Fabian Lofink, Itzehoe (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 780 days.

(21) Appl. No.: 17/398,650

(22) Filed: Aug. 10, 2021

(65) Prior Publication Data

US 2021/0371270 A1  Dec. 2, 2021

Related U.S. Application Data

(63) Continuation of application No. PCT/EP2020/053578, filed on Feb. 12, 2020.

(30) Foreign Application Priority Data

Feb. 13, 2019  (DE) .................. 10 2019 201 889.0

(51) Int. Cl.
    *B81B 3/00*  (2006.01)
(52) U.S. Cl.
    CPC .......... *B81B 3/0051* (2013.01); *B81B 3/0062* (2013.01); *B81B 2201/042* (2013.01);
    (Continued)

(58) Field of Classification Search
    CPC ............... B81B 3/0051; B81B 3/0062; B81B 2203/0163; B81B 2203/0181; B81B 2203/058; B81B 2201/042
    See application file for complete search history.

(56) References Cited

U.S. PATENT DOCUMENTS 6,220,561 B1    4/2001  Garcia
7,081,872 B2    7/2006  Lim et al.
(Continued)

FOREIGN PATENT DOCUMENTS

DE    197 40 244 A1    2/1998
DE    602 12 021 T2    11/2006
(Continued)

OTHER PUBLICATIONS

International Search Report and Written Opinion issued in application No. PCT/EP2020/053578.
(Continued)

*Primary Examiner* — Emily P Pham
(74) *Attorney, Agent, or Firm* — McClure, Qualey & Rodack, LLP

(57) ABSTRACT

A MEMS includes a substrate having an element movably suspended relative to the substrate, the element having a first main surface and an opposite second main surface. The MEMS includes a first spring element connected between the substrate and a first column structure connected to the second main surface, and includes a second spring element connected between the substrate and a second column structure connected to the second main surface.

31 Claims, 13 Drawing Sheets

(52) U.S. Cl.
CPC ............... *B81B 2203/0163* (2013.01); *B81B 2203/0181* (2013.01); *B81B 2203/058* (2013.01)

(56) References Cited

U.S. PATENT DOCUMENTS

| | | |
|---|---|---|
| 7,428,353 B1 | 9/2008 | Milanovic et al. |
| 8,729,770 B1 | 5/2014 | Milanovic |
| 9,221,217 B2 | 12/2015 | Lisec et al. |
| 2003/0048244 A1 | 3/2003 | Lim et al. |
| 2007/0201710 A1 | 8/2007 | Suzuki et al. |
| 2011/0187810 A1 | 8/2011 | Owa et al. |
| 2011/0199177 A1 | 8/2011 | Lehto et al. |
| 2012/0038961 A1 | 2/2012 | Watanabe et al. |
| 2014/0376071 A1 | 12/2014 | Armbruster et al. |
| 2017/0278605 A1 | 9/2017 | Lisec et al. |
| 2017/0297897 A1 | 10/2017 | Duerr et al. |
| 2021/0061642 A1* | 3/2021 | Duerr ................. B81B 3/0051 |

FOREIGN PATENT DOCUMENTS

| | | |
|---|---|---|
| DE | 10 2013 212 102 A1 | 1/2015 |
| DE | 10 2014 226 138 A1 | 6/2016 |
| DE | 10 2015 200 626 B3 | 7/2016 |
| EP | 2 670 880 B1 | 7/2018 |

OTHER PUBLICATIONS

English language translation of International Search Report.
Reimer, T., et al.; "Temperature-stable NdFeB micromagnets with high-energy density compatible with CMOS back end of line technology;" MRS Advances; No. 1; http://journals.cambridge.org/ADV; Jan. 2016; pp. 209-213.

* cited by examiner

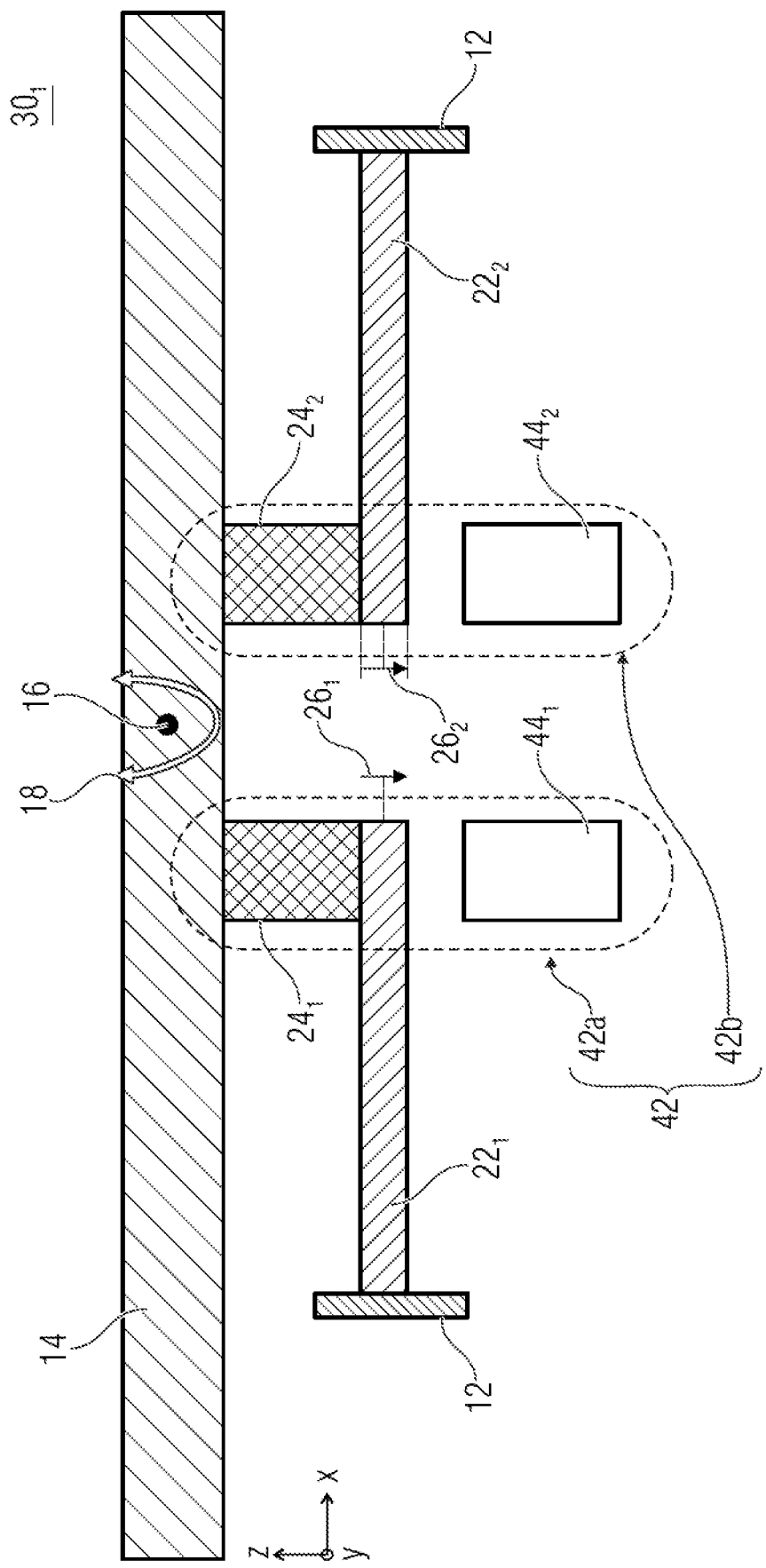

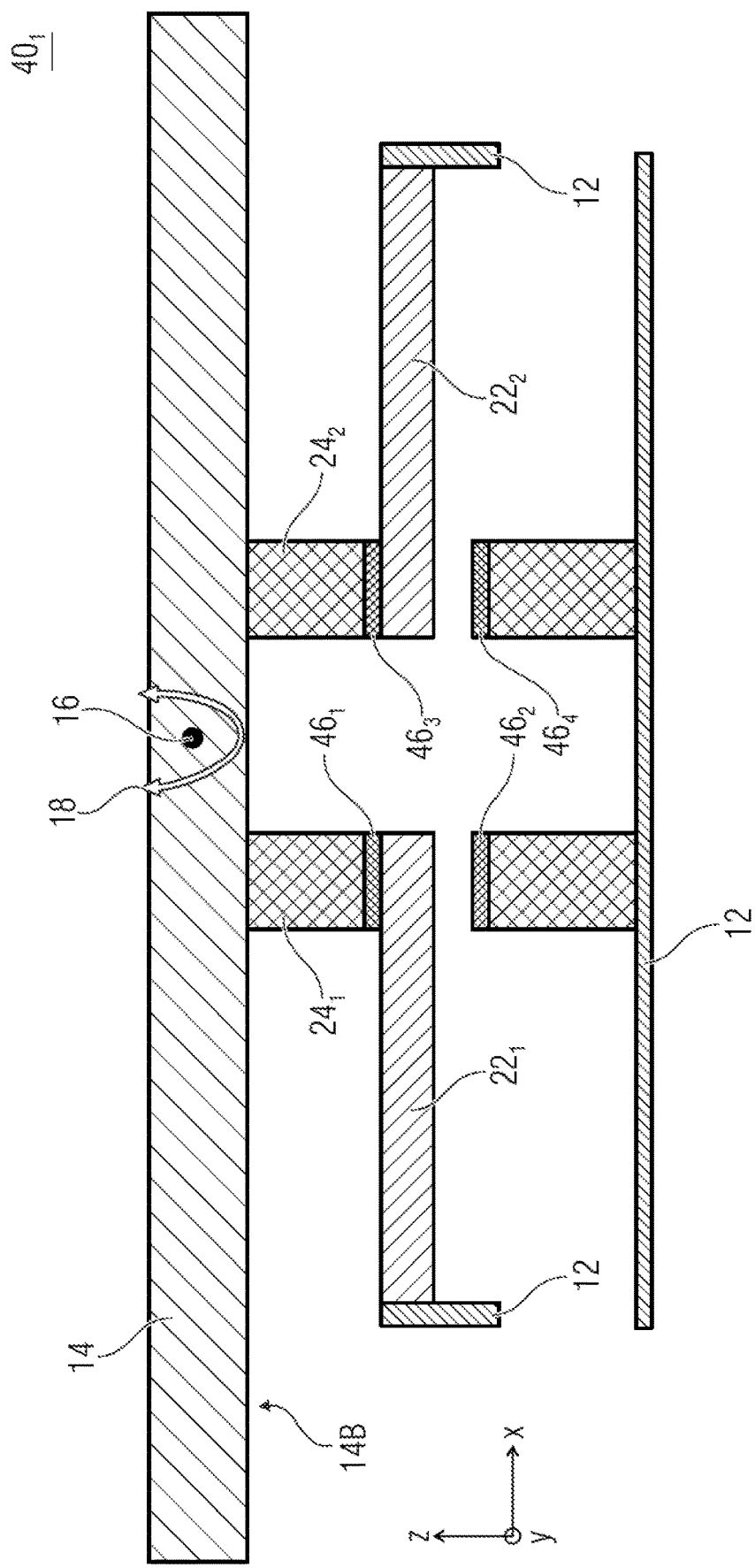

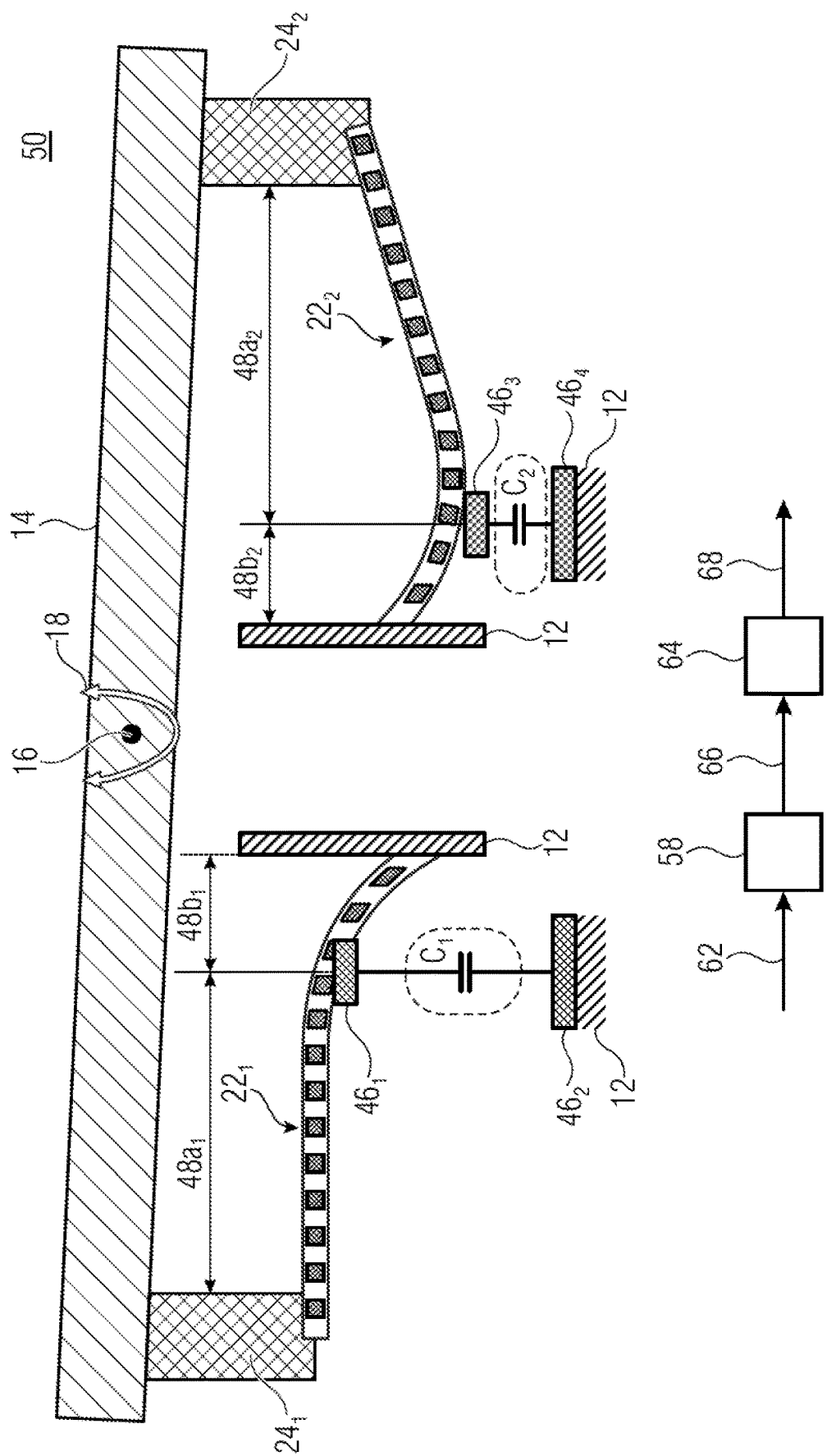

800

┌─────────────────────────────────────────────┐
│ Providing a substrate and an element movably suspended
│ relative to the substrate, the element comprising a first   │—810
│ main surface and an opposite second main surface
└─────────────────────────────────────────────┘
                        │
┌─────────────────────────────────────────────┐
│ Arranging a first spring element between the substrate and a
│ first column structure connected to the second main surface,
│ and arranging a second spring element between the substrate │—820
│ and a second column structure connected to the second
│ main surface
└─────────────────────────────────────────────┘

Fig. 8

MEMS AND METHOD OF MANUFACTURING THE SAME

CROSS-REFERENCE TO RELATED APPLICATIONS

This application is a continuation of copending International Application No. PCT/EP2020/053578, filed Feb. 12, 2020, which is incorporated herein by reference in its entirety, and additionally claims priority from German Application No. 10 2019 201 889.0 filed Feb. 13, 2019, which is also incorporated herein by reference in its entirety.

The present invention relates to a microelectromechanical system (MEMS) and to a method of manufacturing the same. The present invention relates to MEMS having movable elements that are precisely movable, which is made possible by supporting the movable element by two column structures on a main surface. Further, the present invention relates to a 3D MEMS structure comprising a useful plate, columns acting as lever and bending beams.

BACKGROUND OF THE INVENTION

For a MEMS (Microelectromechanical systems) device, minimizing the chip dimension is an essential criterion. Despite the small chip dimensions, the useful area should remain as large as possible. The area efficiency of a MEMS device is described by the fill factor. In the case of a MEMS mirror, for example, the fill factor is defined by the ratio of the aperture area to the chip area. When developing a MEMS mirror, the aim is usually not only to achieve a high fill factor but also a large tilt angle of the mirror plate. However, the achievable deflection depends significantly on the dimension (length) of the actuators, which inevitably reduces the fill factor. The problem is not limited to MEMS mirrors. A high fill factor and large deflections are of interest for all MEMS devices based on a movable useful plate.

There are already MEMS devices where the actuators have been placed below the useful area to obtain a high fill factor while maintaining the length of the actuators. One example is shown in FIG. 9, which is taken from U.S. Pat. No. 7,428,353 B1. The actuators are mostly placed below the mirror plate, allowing a long length. This approach is very efficient, but has one problem, namely that the mirror plate experiences not only the desired tilting motion about the axis of rotation, but also an undesirable lateral displacement.

The lateral displacement means a loss of light in the case of a MEMS mirror. The same depends on the height of the column between elements 300 and 301 on which the mirror plate is built. For a large mirror plate, a high column is needed to geometrically allow the desired tilting motion. In the end, for this approach, this means that for a MEMS mirror with large mirror plate, a tradeoff between limited scan angle and large light loss has to be found.

FIG. 10 shows an exemplary perspective view of a MEMS mirror, which is based on the approach according to FIG. 9. Here, another limitation of the concept is illustrated. Because the hinges 1002 on the faults or actuators 1004 essential to this approach themselves involve a significant area, only a limited number of them can be accommodated. In most cases, the actuators 1004 are arranged orthogonally to each other along the x- and y-axes to implement a two-axis tilt of the mirror plate. As a result, in the diagonal direction, the mirror can obtain only about 70% ($\sqrt{2}/2$) of the maximum tilt angle in x or y direction. The exact value depends on the individual geometry of a device and the actuation and hinge principle used.

MEMS that enable high area efficiency are desired.

SUMMARY

According to an embodiment, a MEMS may have: a substrate and an element movably suspended relative to the substrate, the element having a first main surface and an opposite second main surface; a first spring element connected between the substrate and a first column structure connected to the second main surface, and a second spring element connected between the substrate and a second column structure connected to the second main surface.

According to another embodiment, a method of manufacturing a MEMS may have the steps of: providing a substrate and an element movably suspended relative to the substrate, the element having a first main surface and an opposite second main surface; arranging a first spring element between the substrate and a first column structure connected to the second main surface, and arranging a second spring element between the substrate and a second column structure connected to the second main surface.

A core idea of the present invention is the finding that by suspending a movable element over at least two column structures, lateral displacement of the movable element during a tilting motion can be avoided or at least be small, so that small additional areas have to be provided and thus an area-efficient configuration of the MEMS can be obtained. Further, for optical applications, a light loss is low.

According to an embodiment, a MEMS includes a substrate and an element movably suspended relative to the substrate, the element comprising a first main surface and an opposite second main surface. The MEMS includes a first spring element connected between the substrate and a first column structure connected to the second main surface. The MEMS further comprises a second spring element connected between the substrate and a second column structure connected to the second main surface. By suspending the movable element via two column structures, the aforementioned advantages are obtained.

According to an embodiment, a method of manufacturing a MEMS comprises providing a substrate and an element movably suspended relative to the substrate, the element comprising a first main surface and an opposite second main surface. The method includes arranging a first spring element between the substrate and a first column structure connected to the second main surface, and arranging a second spring element between the substrate and a second column structure connected to the second main surface.

BRIEF DESCRIPTION OF THE DRAWINGS

Embodiments of the present invention will be detailed subsequently referring to the appended drawings, in which:

FIG. 3a is a schematic side-sectional view of a MEMS according to an embodiment comprising magnetic actuator means;

FIG. 4a is a schematic side-sectional view of a MEMS according to an embodiment, with electrostatic actuator means;

FIG. 4b is a schematic side-sectional view of a MEMS according to an embodiment, which has an outward spring curve compared to the MEMS of FIG. 4a;

FIG. 5 is a schematic side-sectional view of a MEMS according to an embodiment, where an electrode element of the actuator means or a sensor means is arranged on or in the spring elements;

FIG. 8 is a schematic flow diagram of a method according to an embodiment;

DETAILED DESCRIPTION OF THE INVENTION

Before embodiments of the present invention will be explained in detail below with reference to the drawings, it should be noted that identical, functionally equal or equal elements, objects and/or structures are provided with the same reference numbers in the different figures, so that the description of these elements illustrated in different embodiments is interchangeable or inter-applicable.

The following embodiments relate to microelectromechanical systems (MEMS). Such systems can be manufactured in silicon technology and/or complementary metal oxide semiconductor (CMOS) technology. Structures can be generated in the corresponding semiconductor technology, for example by material deposition, but can also be obtained by material removal, for example by using etching processes or grinding processes.

Figure 1A:
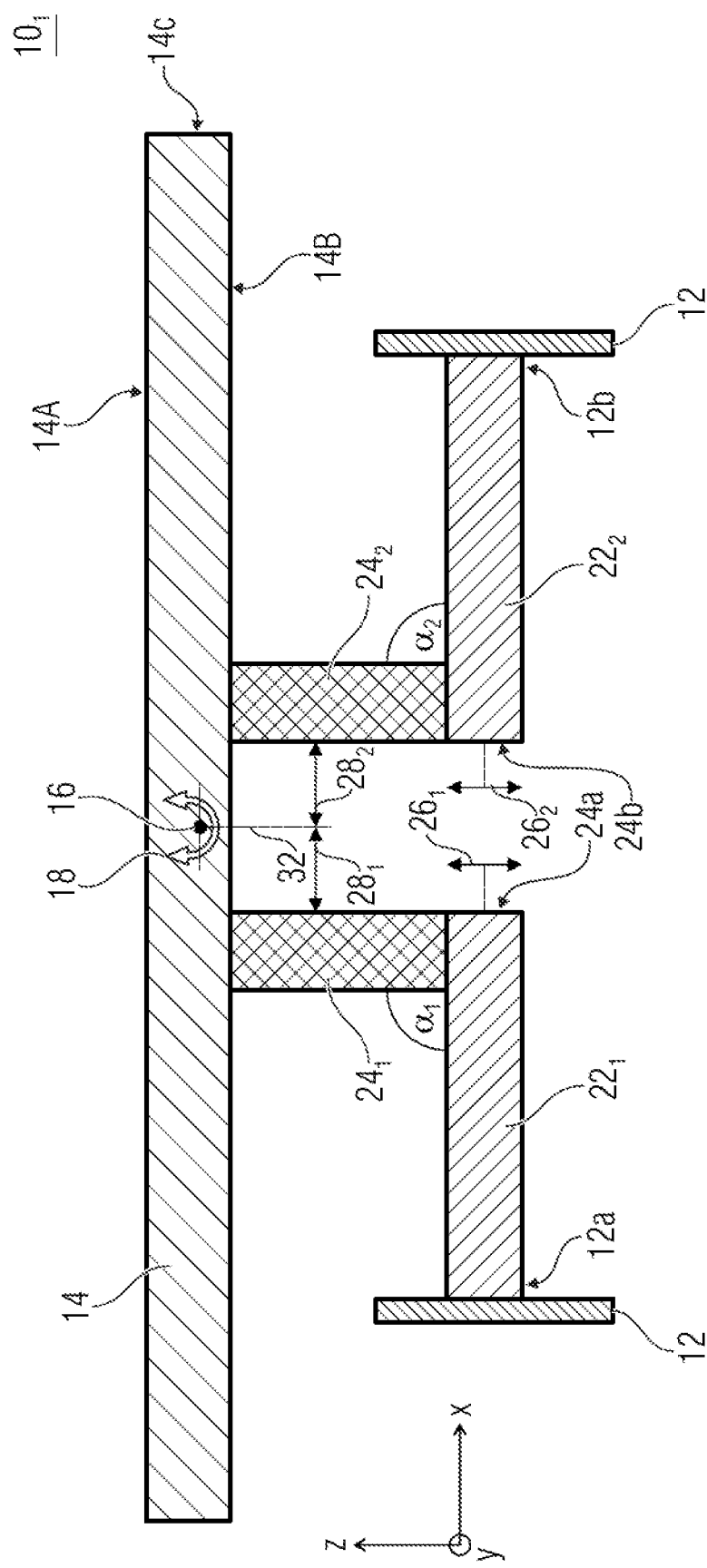
FIG. 1a is a schematic side-sectional view of a MEMS according to an embodiment with spring elements extending outwards.

FIG. 1a shows a schematic side-sectional view of a MEMS $10_1$ according to an embodiment. The MEMS $10_1$ includes a substrate 12 comprising, for example, a semiconductor material, such as polycrystalline or monocrystalline silicon, gallium arsenide, or the like. In the context of the embodiments described herein, the substrate 12 may be considered stationary and may be, for example, part of a chip or the like.

The MEMS $10_1$ further comprises a movable element 14 movably suspended relative to the substrate 12. For example, the moveable element 14 may be moved rotationally, such as by moving the moveable element 14 about an axis of rotation 16. Although the axis of rotation 16 is shown to intersect a volume of the movable element 14 in the depicted resting position, that is, in the absence of external acting forces, the axis of rotation 16 may also be disposed outside the volume of the movable element 14, such as adjacent to a second main surface 14B opposite to the first main surface 14A facing the substrate. The axis of rotation 16 is arranged as close as possible to the illustrated position within the volume of the movable element 14.

For example, the main surfaces 14A and 14B are connected to each other by one or more side surfaces 14C, such as a lateral area of a cylinder body to which the main surfaces 14A and 14B form the lid areas.

The movable element may be, for example, a mirror element, wherein the main surface 14A is formed in a mirror-like manner. However, embodiments are not limited thereto. Alternatively or additionally, the main surface 14A may have another function, for example an electrically conductive function, such that the MEMS $10_1$ may be used as an electrical switch, for example.

The movable element 14 may be supported on or suspended from the substrate 12 via spring elements $22_1$ and $22_2$. Mounting areas 12a and 12b, where the respective spring element $22_1$ or $22_2$ is connected to the substrate 12, may be spatially spaced apart. The spring elements $22_1$ and $22_2$ may extend in a plane parallel to the main surface 14B in a load-free state of the MEMS. Forces introduced by actuators and/or external forces, including weight forces, may cause the spring elements to deflect.

A column structure $24_1$ may be arranged between the spring element $22_1$ and the main side 14B, which may be considered as a rigid body with respect to the spring element $22_1$ and approximately does not undergo or perform any deformation during regular operation of the MEMS $10_1$.

The main surfaces 14A and 14B may be arranged parallel to an x/y plane in space. Spring elements $22_1$ and $22_2$ may be arranged parallel thereto. The spring elements $22_1$ and $22_2$ may be configured to perform an out-of-plane movement with respect to planes parallel to the x/y plane when external forces are applied to them, such as by using actuators. Thereby, ends 24a and 24b of the spring elements $22_2$ and $22_2$ facing away from the substrate 12 can be deflected along the direction z perpendicular to y and x, respectively. That is, the ends 24a and 24b can be deflected along directions of movement $26_1$ and $26_2$, respectively, which are at least approximately parallel to the z direction. An in-phase movement of the ends 24a and 24b may allow translational displacement of the movable element 14 along positive z-direction or negative z-direction. An opposite phase movement may provide the rotational movement 18.

The column structure $24_1$ is arranged at an angle α1 with respect to the spring element $22_1$. For example, the spring element $22_1$ may extend substantially parallel to the main surface 14B in the illustrated resting state. The column structure $24_1$ may have an axial extension, such as a length or height of a cylinder structure, extending in space along the directions of movement $26_1$ and $26_2$, respectively. Thereby, the column structure $24_1$ can act as a lever with respect to the movement performed by the spring element $22_1$. Accordingly, the column structure $24_2$ may be arranged inclined at the angle α2 with respect to the spring element $22_2$. For example, the column structures $24_1$ and $24_2$ may be arranged perpendicular to the main surface 14B within manufacturing tolerances, allowing for ease of production. Manufacturing tolerances may arise, for example, from etching processes that may cause inclined sidewalls of the column structures 24, but may leave a substantially perpendicular configuration of at least the central axis or neutral fiber along the axial extension unaffected.

The column structures $24_1$ and $24_2$ may also include semiconductor material, but may alternatively or additionally also include other and in particular functional materials which, for example, have a magnetic, piezoelectric or electrically conductive property. Here, a geometry of the column structure $24_1$ and $24_2$ is not limited to round, oval or elliptical configurations, in particular with regard to a cross-section parallel to an x/y plane, but can also extend polychronously, for example rectangularly, in this plane.

The column structures $24_1$ and $24_2$ are arranged symmetrically with respect to the axis of rotation 16, which may also be referred to as the tilting axis. For this purpose, the column structures $24_1$ and $24_2$ have equal distances $28_1$ and $28_2$ to a plane 32, which extends parallel to the y/z plane in space and intersects the axis of rotation 16.

As shown in FIG. 1a, the spring elements $22_1$ and $22_2$ may extend outwards from the column structures $24_1$ and $24_2$ towards the substrate 12, wherein "inner" may mean an area of a centroid of the movable element 14 and "outward" may mean a direction from that point towards outside of the movable element 14.

Figure 1B:
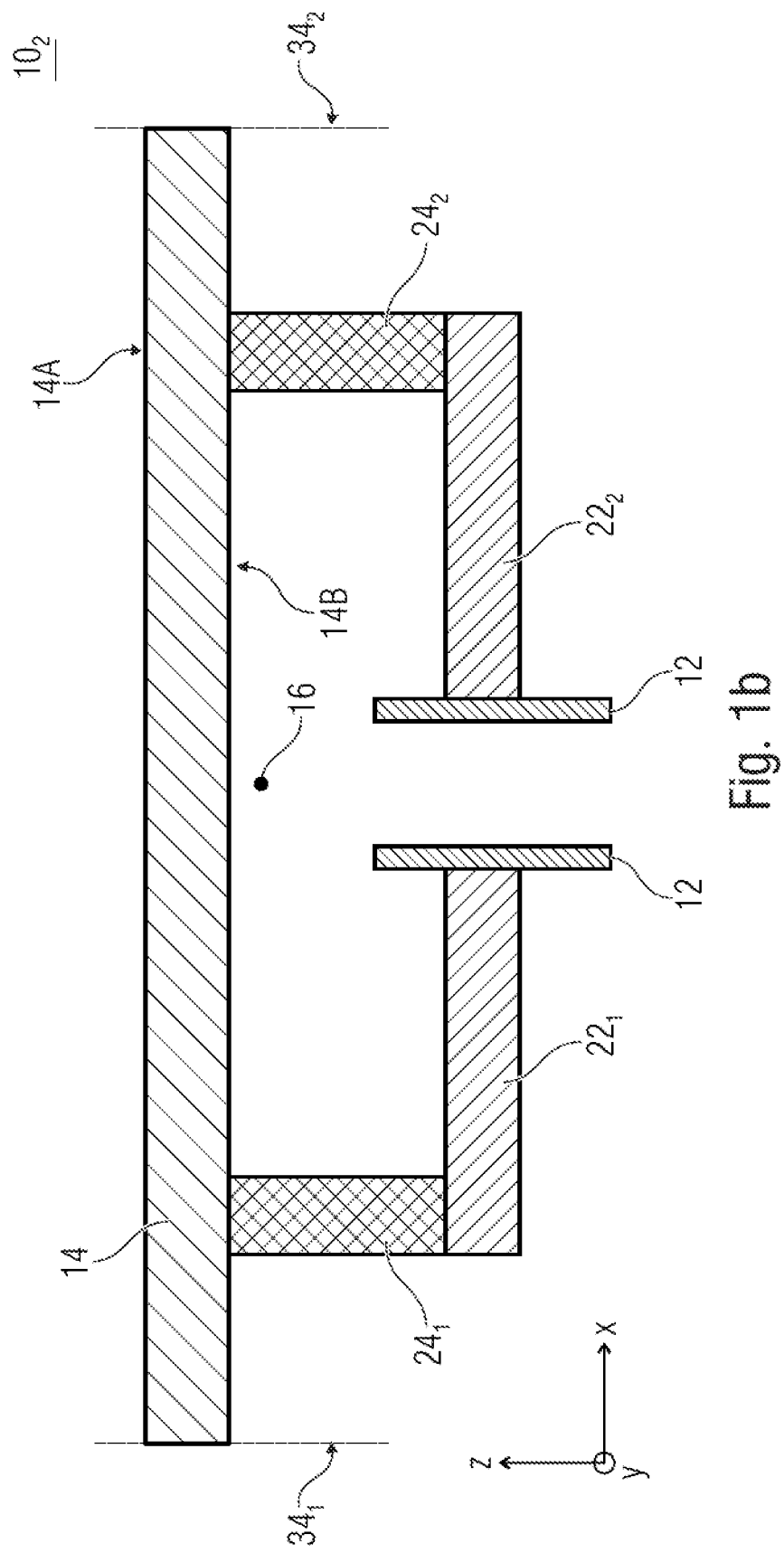
FIG. 1b is a schematic side-sectional view of a MEMS according to an embodiment with spring elements extending inwards.

FIG. 1b shows a schematic side-sectional view of a MEMS $10_2$ according to an embodiment corresponding to the MEMS $10_1$, but where the spring elements $22_1$ and $22_2$ extend inwards from the column structures $24_1$ and $24_2$. For this purpose, the column structures $24_1$ and $24_2$ are arranged at a greater distance from each other and from the axis of rotation 16 compared to the MEMS $10_1$. Compared to the MEMS $10_1$, this allows more precise control of the movable element 14, possibly at the expense of a leverage obtained by the column structures $24_1$ and $24_2$. This leverage is influenced by a distance of the column structures $24_1$ and $24_2$ from the axis of rotation 16. However, these losses can be compensated for by appropriate geometries of the spring elements $22_1$ and $22_2$, by lengths of the column structures $24_1$ and $24_2$, by actuator forces and other means described herein.

The illustration of FIG. 1b further differs from FIG. 1a in that the axis of rotation 16 is arranged adjacent to the main surface 14B. For example, the same is arranged outside a volume of the movable element 14. The exact position of the axis of rotation 16 may be influenced by the geometry of the spring elements $22_1$ and $22_2$ as well as the column structures $24_1$ and $24_2$.

Similar to what is shown for the MEMS $10_1$, the MEMS $10_2$ is also configured such that the column structures $24_1$ and $24_2$, the spring elements $22_1$ and $22_2$, optionally the substrate 12, and any actuator technology that may be arranged is covered by the main side 14B, simply put, these elements are arranged below and/or behind the movable element 14. This may also be understood to mean that said elements do not project above sides 341 and 342 defined by a projection of the movable element 14 in an x/y plane along the z-direction. However, embodiments are not limited thereto. According to further embodiments, the spring element $22_1$ and $22_2$ protrude beyond the useful area of the main surface 14A to an extent of at most 50%, at most 30% and even more advantageously, at most 10%, i.e., protrude beyond sides 341 and 342.

In other words, FIGS. 1a and 1b show embodiments of a MEMS device with a movable useful area, two support elements, two flexible springs, and two fixations, i.e., the substrate 12.

Figure 2:
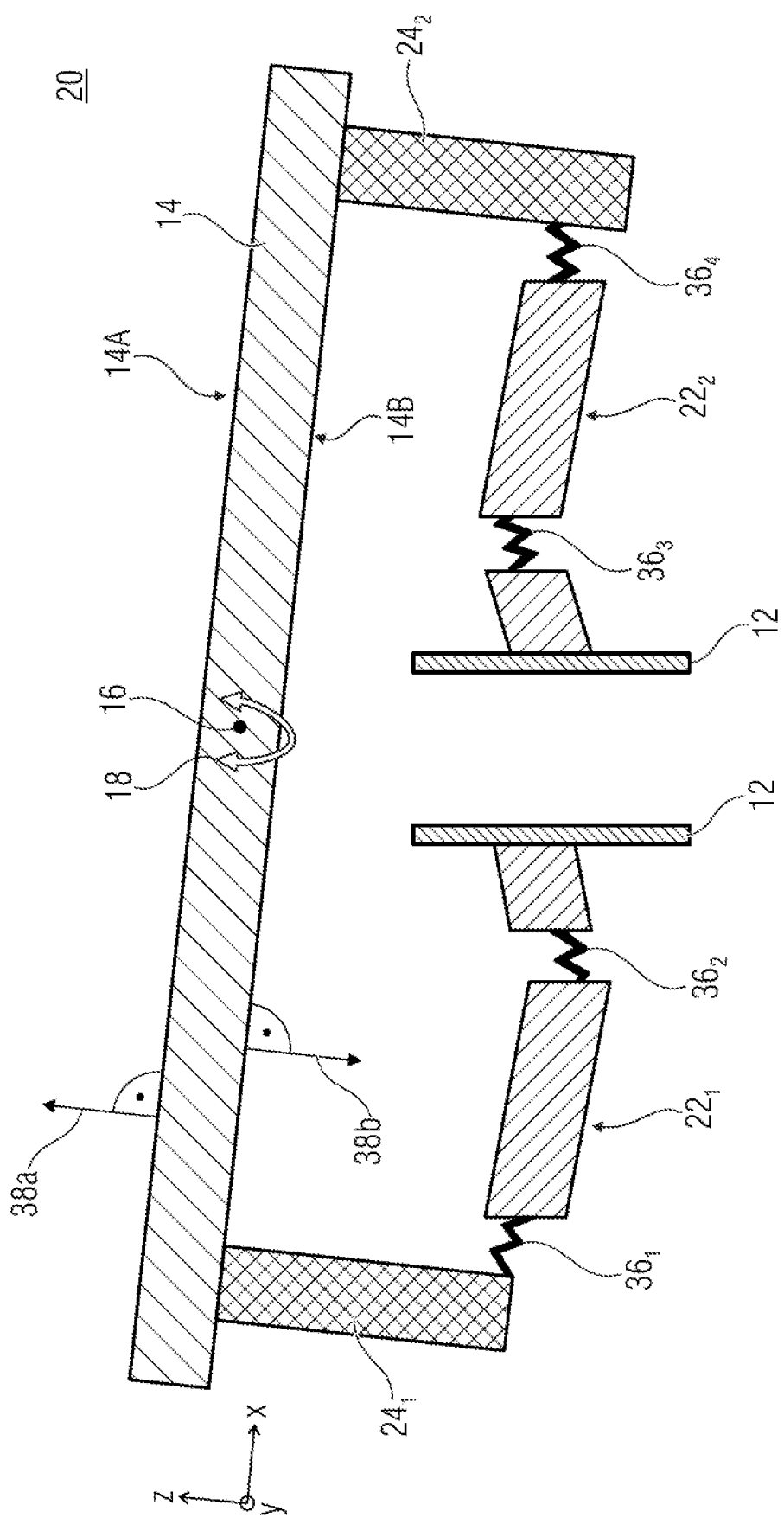
FIG. 2 is a schematic side-sectional view of a MEMS according to an embodiment where the spring elements comprise hinges.

FIG. 2 shows a schematic side-sectional view of a MEMS 20 according to an embodiment, the structure of which is based on the structure of the MEMS $10_2$, whereby the explanations are equally valid for a structure according to the MEMS $10_1$. The spring elements $22_1$ and $22_2$ may include one or more hinges 36. Hinges may be sections of the spring elements $22_1$ and/or $22_2$ and/or elements introduced or provided specifically for this purpose, which are intended to deform particularly strongly relative to other areas of the spring elements $22_1$ and/or $22_2$, so that the deformation can be concentrated here and the other areas can be comparatively rigid. In the area of the hinges, for example, compared to the other areas, at least 1.5-fold, 2-fold, 3-fold or more deformation can take place.

Embodiments provide that the spring elements $22_1$ and $22_2$ are both provided with hinges 36, which allows a symmetrical spring force for the rotational movement 18 in both directions. In contrast, other embodiments provide that only one of the spring elements $22_1$ or $22_2$ is provided with a hinge 36, that a different number of hinges 36 is provided, and/or that a stiffness reduction provided by the hinges provided in the spring elements $22_1$ or $22_2$ is different overall or at least locally. Thereby, an adjustment of the movement amplitude of the rotational movement 18 can be adjusted, so that, for example, different movement amplitudes in different directions can be obtained by identically configured actuators or identical actuator forces, which enables a simple control.

One or more of the hinges $36_1$ to $36_4$ may be at least partially implemented by a local change in a spring material and/or by a local change in a spring structure of the spring elements $22_1$ and $22_2$, respectively, although combinations are also possible. For example, a local change of the spring structure may comprise thinning of the spring element. The hinges $36_1$, $36_2$, $36_3$ and/or $36_4$ can alternatively or additionally also be implemented by a material different from materials of the spring element $22_1$ and/or $22_2$, wherein functional materials, for example electrically conductive, magnetic or micromagnetic and/or piezoelectric materials, which enable transmission or generation of forces, can be particularly suitable for this purpose.

In other words, in inventive MEMS devices or MEMS actuators, the hinges $36_1$, $36_2$, $36_3$ and/or $36_4$ can be realized as a local softer structure, such as comprising folded springs, of the bending beam when the force is progressively transmitted via the bending beam structure, such as springs or piezoelectric and/or thermal actuators, in a derivable manner, i.e. continuously. Alternatively, at least one of the hinges $36_1$ to $36_4$ can also be a turning point of the springs or be arranged at a location where a bending line of the spring elements $22_1$ or $22_2$ defines a turning point of a derivative function, since force acts locally and concentratively on this point, for example by capacitive or magnetic forces.

By arranging hinges $36_1$ to $36_4$, leverages can be increased or reductions thereof can be compensated. Thus, not only can the MEMS $10_2$ be extended with one or several hinges in one or several spring elements, but it is also possible to extend MEMS $10_1$ with corresponding spring elements. Referring again to FIGS. 1a and 1b, both devices solve the problem of lateral displacement of the movable useful area of the movable element 14 within a MEMS device when the same is tilted and allows the same high tilt angle regardless of the tilt direction. The useful area may be the aperture plate of a MEMS mirror, but the invention is not limited to MEMS mirrors. A first essential feature of the invention is that the movable useful area is supported by support elements, the column structures 24, which in turn are suspended from flexible springs, the spring elements 22. FIG. 1a and FIG. 1b show possible embodiments using two columnar support elements. Here, it is important that the connecting points of the support elements with the flexible springs are located away from the center of rotation 16 as well as the plane 32. From this point of view, the support elements, which serve primarily as levers, can assume any shape and can also merge into one another, even though the embodiments described herein describe separately arranged columnar support elements. The greater the distance between the support elements, for example by increasing the distance in the MEMS $10_2$ compared to the MEMS $10_1$, the smaller the lateral displacement of the movable element 14 triggered by the tilting can be. Therefore, if the geometric dimensions of the column structures, the spring elements and the movable element are the same, it may occur that the lateral displacement of the MEMS $10_2$ is smaller than the lateral displacement of the MEMS $10_1$. On the other hand, however, the MEMS $10_1$ has the advantage of a stronger leverage achieved, since the point of action at the free ends of the flexible springs, i.e. the transition to the column structures 24, is closer to the center of rotation of the useful area.

The hinges $36_1$ to $36_4$ can now be used, among other things, to at least partially compensate the reduced leverage of the MEMS $10_2$ compared to the MEMS $10_1$ by increasing the lever by the hinges $36_1$ to $36_4$ within the flexible springs $22_1$ and $22_2$. Although two spring elements $36_1$ and $36_2$ or $36_3$ and $36_4$ are shown, a different number of hinges ≥0 may be implemented, for example at least 1, at least 2, at least 3, or at least 4. The hinges 36 may be realized by folding the spring, for example.

Locations of the arrangement of hinges 36 in the spring element can be selected depending on the needs of the MEMS. The smaller a distance of the hinge with respect to the substrate 12, the more effective the hinge is in terms of amplifying the leverage. At the same time, however, the hinge provides higher resistance there. Conversely, a soft location due to a hinge results in a large deflection, but at the same time, a self-deformation consumes forces introduced into the spring elements 22 and may therefore result in a lower actuator effect. Above that, the hinges 36 can be used to correct a displacement of the movable element 14 along the z-direction. For this purpose, embodiments provide for an arrangement of the hinges $36_1$ or $36_4$ in a transition region between the spring elements $22_1$ and $22_2$, respectively, and the associated column structure $24_1$ and $24_2$, respectively, to enable correction or compensation of a displacement of the movable element 14 along the z-direction.

Different implementations of the hinges 36 may correspond to each other in that stiffness reduction is obtained along a direction parallel to a surface normal $38b$ of the main surface 14B. In a plane-parallel configuration, this may also mean a stiffness reduction parallel to a surface normal $38a$ of the main surface 14A. In each case, the possibly hypothetical state of an unaffected or force-less MEMS can be used for this purpose.

Embodiments provide for a spring element to have a hinge adjacent to the column structure, such as hinges $36_1$ and $36_4$. In addition, the spring elements may have another hinge arranged adjacent to the substrate, such as hinges $36_2$ and $36_3$. The hinges $36_2$ and $36_3$ may also be arranged directly on the substrate 12, alternatively or additionally, it is possible that the hinges $36_1$ and/or $36_4$ are spaced apart from the column structure 24 by a regular or other portion of the spring element, analogous to the spacing from the substrate 12.

FIG. 3a shows a schematic side-sectional view of a MEMS $30_1$ according to an embodiment whose structure is based on the structure of the MEMS $10_1$, the explanations being equally valid for a structure according to the MEMS $10_2$. The MEMS $30_1$ includes actuator means 42 comprising at least one part 42a and/or 42b, each part 42a and 42b being configured to generate a force in at least one spring element $22_1$ and/or $22_2$ to effect deflection of the movable spring element 14. The actuator portion 42a may be configured to generate an actuator force in an area of the column structure $24_1$. The part 42b may be configured to generate a force in the area of the column structure $24_2$, so that, based on the generated force, a deflection of the column structure $24_1$ and/or $24_2$ may be obtained, which may be translated into a translational and/or rotational movement of the movable spring element 14 via the support of the same on the substrate 12 by means of the spring elements $22_1$ and $22_2$.

For example, the actuator 42 may provide at least one of a thermally induced actuator force, a piezoelectrically induced actuator force, an electrostatically induced actuator force, and a magnetically induced actuator force. As an alternative, or in addition to generating a force acting on the column structures $24_1$ and/or $24_2$, a force may be generated on or in the spring elements $22_1$ and/or $22_2$ such that the actuator force is generated in an area of the respective spring element $22_1$ and/or $22_2$.

Thus, the column structure $24_1$ and/or the column structure $24_2$ may comprise a magnetic material or, alternatively, a magnetizable material. The actuator means 42 may be configured to generate a magnetic field adjacent to the magnetic material to effect movement of the movable element 14. For example, controllable magnets $44_1$ and $44_2$ may be disposed in spatial proximity to column structures $24_1$ and $24_2$, respectively, such that activation of the magnet $44_1$ results in a magnetic force between the magnet $44_1$ and the column structure $24_1$ to effect movement of the movable element 14 at that location along the direction of movement $26_1$. By activating the magnet $44_2$, a force may be obtained between the magnet $44_2$ and the column structure $24_2$, which may result in deflection of the column structure $24_2$ and consequently the movable element 14 along the direction of movement $26_2$. Thus, in-phase activation of the magnets $44_1$ and $44_2$ may result in translational movement of the movable element 14 along positive or negative direction of movement 26, while opposite-phase activation may result in the rotational movement 18.

In other words, the support elements or columns may include a hard magnetic material so that they can be actively moved bidirectionally by means of magnetic fields, e.g. generated by coils.

Figure 3B:
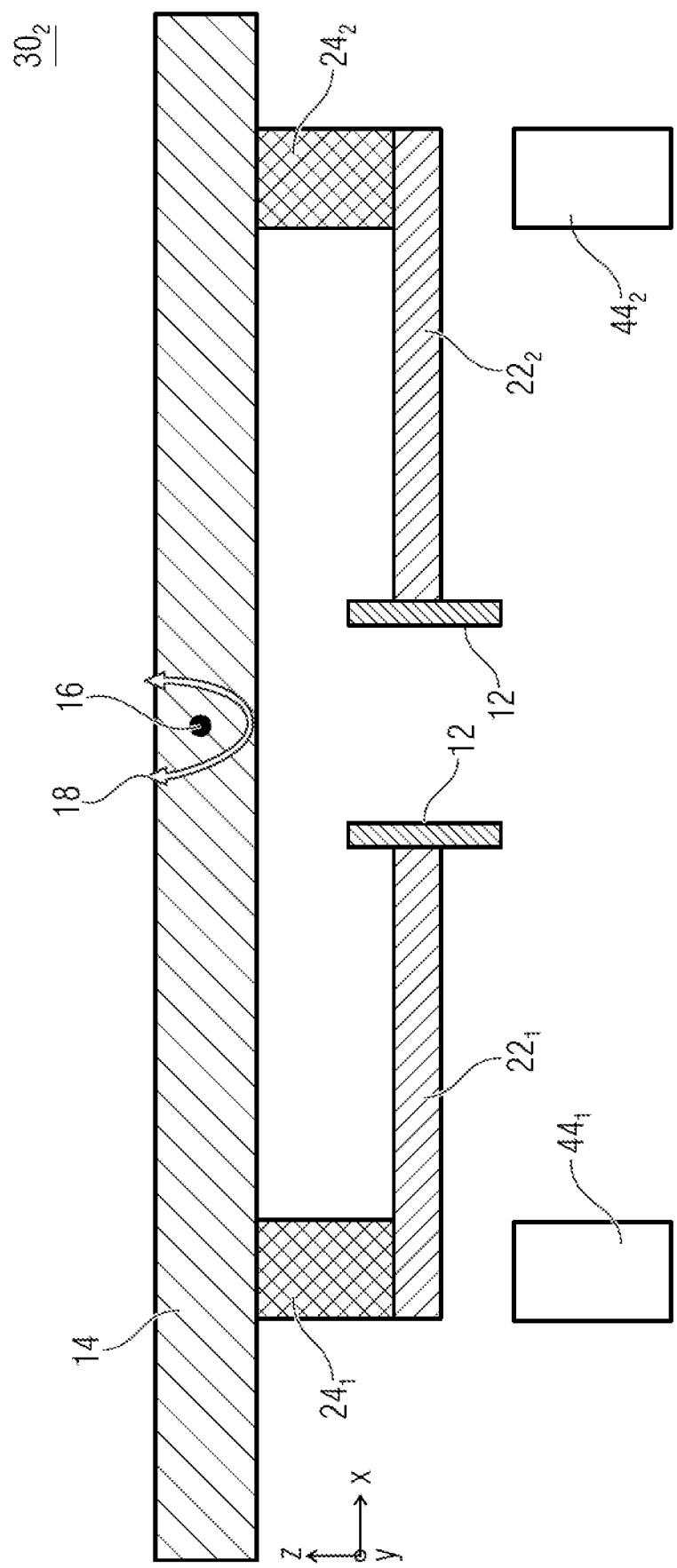
FIG. 3b is a schematic side-sectional view of a MEMS according to an embodiment comprising the magnetic actuator means and spring elements extending outwards.

FIG. 3b shows a schematic side-sectional view of a MEMS $30_2$ whose structure is based on the structure of the MEMS $10_2$, wherein the explanations are equally valid for a structure according to MEMS $10_1$. Similar to the structure of the MEMS $10_2$, spring elements $22_1$ and $22_2$ are directed outward from the substrate 12. The column structures $24_1$ and $24_2$ may include magnetizable or magnetic material, as described in connection with the MEMS $30_1$. The column structures $24_1$ and $24_2$ may be formed to be magnets or comprise magnets. For example, high-performance NdFeB (neodymium-iron-boron) micromagnets may be arranged. This can be produced, for example, by agglomeration of micrometer-sized powder using atomic layer deposition (ALD) and integrated into MEMS devices at substrate level. Such a method is described, for example, in [1] or [2]. Significant forces can already be generated using micromagnets with diameters between 50 μm and 500 μm, and arbitrary sizes and/or forces can be used depending on the application. The generated forces can be transmitted over distances in the millimeter range, which is sufficient for MEMS applications.

In other words, FIGS. 3a and 3b show embodiments of a MEMS device having a movable useful area, two support elements with columns of a hard magnetic material therein, two flexible springs, and two fixations.

FIG. 4a shows a schematic side-sectional view of a MEMS $40_1$ according to an embodiment whose structure is based on the structure of the MEMS $10_1$, wherein the explanations are equally valid for a structure according to the MEMS $10_2$. The actuator means has an electrode structure including electrodes $46_1$ to $46_4$, wherein the electrode structure may comprise pairs of electrodes $46_1$ and $46_2$, respectively. The electrode pairs may each comprise electrodes $46_1$ and $46_3$ that are movable relative to electrodes $46_2$ and $46_4$ arranged on the substrate 12, respectively, such that electrostatic actuators are implemented by the electrode pairs. The electrodes $46_1$ and $46_3$ may be arranged, for example, on the column structures $24_1$ and $24_2$, at ends thereof facing away from the main surface 14B, so as to be as close as possible to the respective other electrodes $46_2$ and $46_4$.

The electrodes $46_2$ and $46_4$ arranged or supported on the substrate 12 may be free of contact with the opposing column structure $24_1$ and $24_2$ respectively, and the spring element $22_1$ and $22_2$, respectively, particularly in the no-load resting state.

Regardless of the implementation of the actuator, the MEMS described herein may be configured such that the substrate 12, on which the spring elements $22_1$ and $22_2$ are arranged, protrudes beyond the spring elements $22_1$ and $22_2$ along positive z-direction, i.e. towards the main surface 14B only to an extent of 100 μm, 50 μm, 10 μm, and most advantageously not. This results in a high rotational amplitude and movement amplitude of the movable element 14.

Figure 4B:
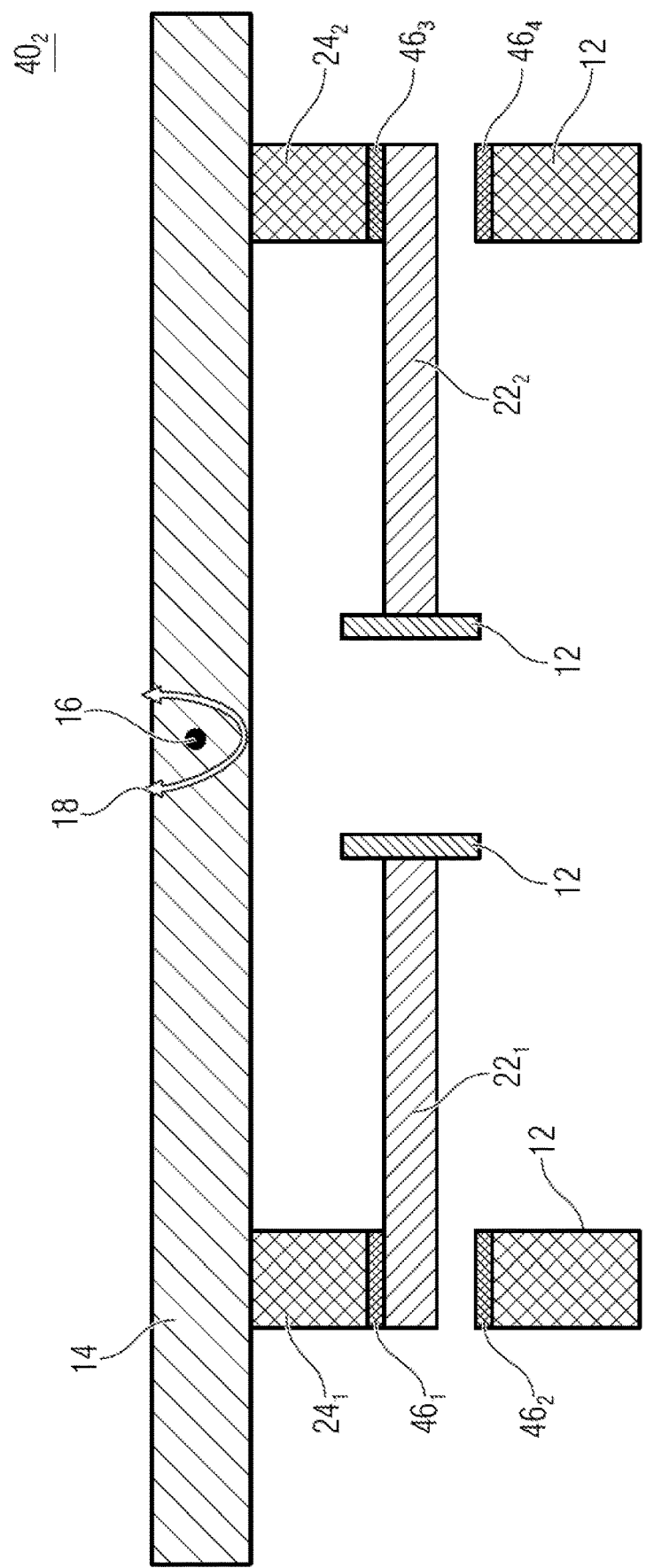

FIG. 4b shows a schematic side-sectional view of a MEMS $40_2$ according to an embodiment having a similar structure as the MEMS $40_1$, but implementing the spring curve outwards as described in connection with the MEMS $10_2$, 20, and $30_2$.

The spring elements $22_1$ and $22_2$ of the MEMS $40_1$ and $40_2$ can be formed from an electrically insulating material or at least from a material that prevents a short circuit between the electrodes $46_1$ and $46_2$ or $46_3$ and $46_4$ in the event of indirect contact via the spring elements $22_1$ and $22_2$, respectively. An equally possible electrically conductive property of the spring elements can be supplemented by arranging an insulating layer between the respective spring element $22_1$ and $22_2$, respectively, and at least one adjacent electrode $46_1$ and/or $46_2$ and $46_3$ and/or $46_4$, respectively.

In other words, FIGS. 4a and 4b show embodiments of a MEMS device with a movable useful area, two support elements with capacitive electrodes, two flexible springs and two fixations. The support elements, i.e., the column structures, can also be moved electrostatically. High forces can be obtained by implementing large electrode areas, for example by using large diameter support elements or electrodes protruding beyond the column structures. Alternatively or additionally, small electrode distances can be implemented.

FIG. 5 shows a schematic side-sectional view of a MEMS 50 according to an embodiment where an electrode element $46_1$ and $46_3$, respectively, of the actuator means is arranged on or in the spring elements $22_1$ and $22_2$, respectively. Exemplarily, the spring elements $22_1$ and $22_2$ extend outwards from a suspension on the substrate 12, although another implementation, for example one extending inwards, is also possible.

Other than described for the MEMS $40_1$ and $40_2$, the spring elements $22_1$ and $22_2$ are formed electrically conductive at least in some areas and/or the electrode $46_1$ and $46_3$, respectively, is arranged thereon. It may be advantageous to arrange the actuator means with the electrode pairs $46_1$ and $46_2$ or $46_3$ and $46_4$ relatively close, i.e. adjacent to, the substrate 12 in order to take advantage of the high forces, which at the same time have relatively small local travel distances. However, the pairs of electrodes $46_1$ and $46_2$ or $46_3$ and $46_4$ can be arranged at a different location. The electrodes $46_1$ and $46_3$ can be arranged on or in a material of the spring elements $22_1$ and $22_2$. The deflected state of the MEMS 50 shown in FIG. 5 may be obtained, for example, when an electric voltage is applied only between the electrodes $46_3$ and $46_4$, wherein an electric capacitance $C_2$ arranged between the electrodes $46_3$ and $46_4$ may be, for example, different from that between the electrodes $46_1$ and $46_2$ when an electric voltage is applied between these electrodes to obtain a counter-rotational movement 18.

A distance $48b_1$ between the substrate 12 and the electrode $46_1$ set in relation to a distance $48a_1$ between the electrode $46_1$ and the column structure $24_1$ can quantify an achievable leverage for the actuator deflection, as well as a ratio between the comparable distances $48b_2$ and $48a_2$ between the electrode $46_3$ and the substrate 12 on the one hand and the column structure $24_2$ on the other hand. This can be used as a configuration criterion for the MEMS 50. The greater the proportion $48a$ of a total length of the spring element 22, the greater the achievable leverage may be.

The MEMS 50 may comprise sensor means 58 configured to detect a position and/or an orientation of the movable element 14. For this purpose, the sensor means 58 may detect an input signal 62 from a measuring means configured for this purpose, which detects the position and/or orientation of the movable element 14 electrically, optically, mechanically and/or piezoelectrically. According to an embodiment, the sensor means 58 is configured to obtain the input signal 62 from the electrodes $46_1$ to $46_4$, meaning that the electrodes $46_1$ and $46_4$ can also be used as a sensor as an alternative or in addition to being used as an actuator.

A control means 64 may be configured to regulate the actuator means to deflect the movable element 14 from its resting position based on the detected position and/or orientation of the movable element 14. This enables the control means 64, which is configured to control the actuator means 42, to be provided with information in the form of a corresponding signal 66 in order to configure a control signal 68 for the actuator means 42 so as to obtain a closed control loop. The use of the electrodes $46_1$ to $46_4$ in connection with the sensor means 58 can be combined by additional elements for force generation.

Figure 6:
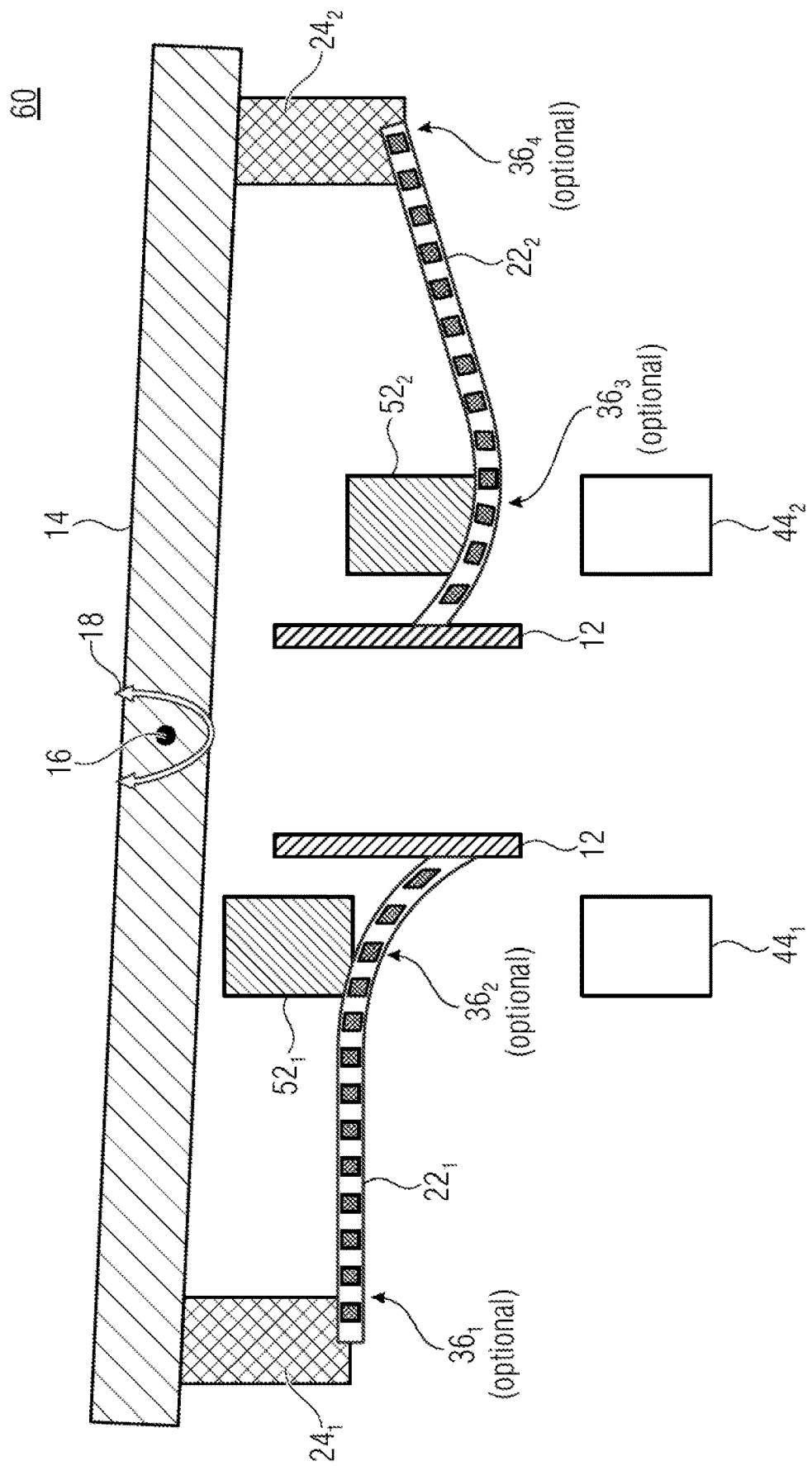
FIG. 6 is a schematic side-sectional view of a MEMS according to an embodiment where the spring elements comprise a magnetic material or magnetizable material.

FIG. 6 shows a schematic side-sectional view of a MEMS 60 according to an embodiment where the spring elements $22_1$ and $22_2$ comprise the magnetic material or magnetizable material described in connection with MEMS $30_1$ and $30_2$. The structure of the MEMS 60 may be based on the structure of the MEMS $10_2$, wherein the explanations are equally valid for a structure according to the MEMS $10_1$. Here, the magnetic or magnetizable material $52_1$ and $52_2$ may be integrated into the area elements 22, so that the block-by-block illustration on the spring elements $22_1$ and $22_2$ is to be understood as merely exemplary and schematic. The actuator means may include the magnets $44_1$ and $44_2$ to generate the forces used to deflect the movable element 14.

A location of force induction into the spring elements $22_1$ and/or $22_2$ can provide a turning point of the bending line of the spring element, just as in FIG. 5, here including both continuous and discontinuous changes of direction.

The actuator modes of operation of the MEMS 50 and 60 may be combined. Alternatively or additionally, it is also possible to use thermal and/or piezoelectric actuators to obtain a deflection of the movable element 14. The actuators or elements thereof may be arranged on or in the column structures $24_1$ and/or $24_2$, on or in the spring elements $22_1$ and/or $22_2$, and/or at transitions between spring elements and column structures or column structures and movable element or spring element and substrate 12.

In other words, FIGS. 5 and 6 show embodiments of MEMS devices with a movable useful area, two support elements, two flexible springs, and two fixations. Optionally, hinges $36_1$ to $36_4$ may be implemented as described in connection with the MEMS 20. Locations of the hinges 36 may correspond to transitions between the spring elements 22 and the column structures 24 on the one hand and locations of force generation by the actuator means on the other hand, each of which may be implemented individually. For example, a corresponding hinge can be implemented by integrating the magnetic material 52 into the spring element 22. That is, hinges may consist of or at least include capacitive electrodes or magnetic components.

Figure 7:
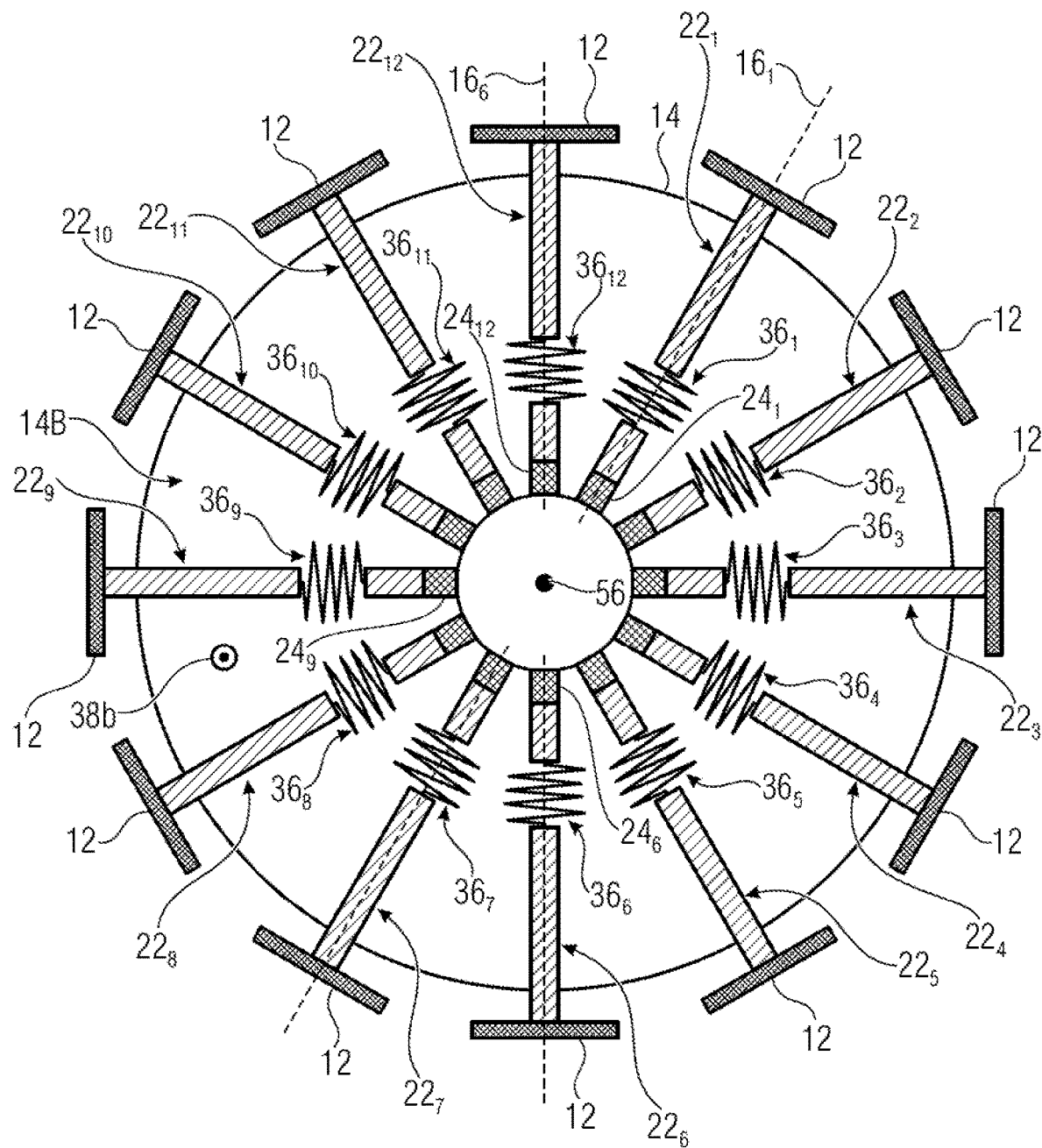
FIG. 7 is a schematic view of a bottom of a MEMS according to an embodiment, which comprises a total of twelve spring elements arranged in a rotationally symmetrical manner around a tilting center.
Figure 9:
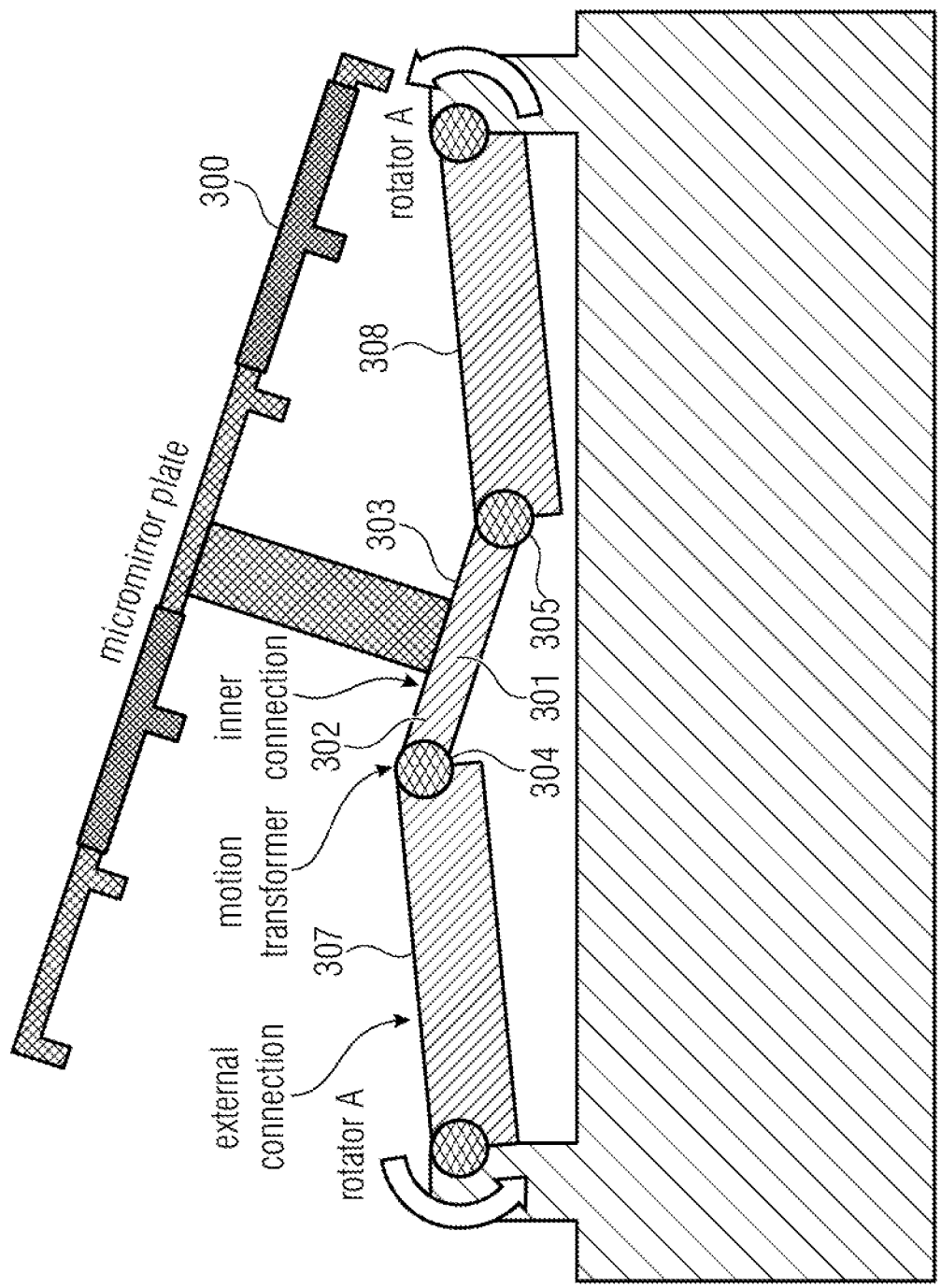
FIG. 9 is a side-sectional view of a known MEMS.
Figure 10:
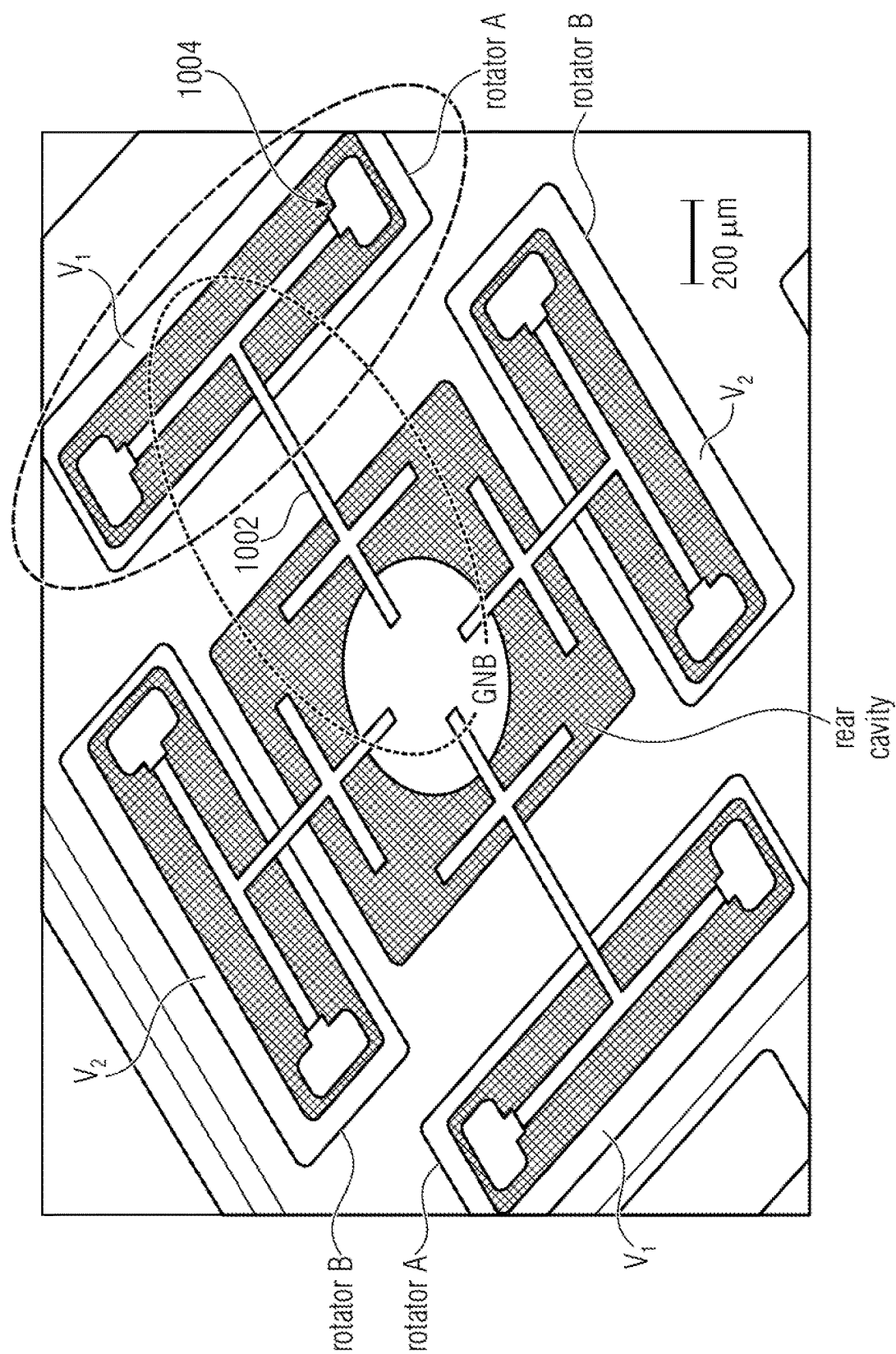
FIG. 10 is an exemplary perspective view of a MEMS mirror based on the approach shown in FIG. 9.

FIG. 7 shows a schematic view from a bottom of a MEMS 70, which comprises a total of twelve spring elements arranged in a rotationally symmetrical manner about a tilting center 56. Although the spring elements $22_1$ to $22_{12}$ are shown as extending radially outwards from the column structures $24_1$ to $24_{12}$, inward extension is also possible, and mixed forms can also be implemented.

The tilting center 56 may coincide with the axis of rotation 16, although a higher number of axes of rotation may be obtained based on the arrangement of spring elements $22_1$ to $22_{12}$, for example six. The number of twelve spring elements $22_1$ to $22_{12}$, connecting a total of twelve associated column structures $24_1$ to $24_{12}$ to the substrate 12, is selected merely as an example. A higher number of such elements associated with the MEMS $10_1$, $10_2$, 20, $30_1$, $30_2$, $40_1$, $40_2$, 50, and 60 includes any number ≥3. The tilting center 56, when projected into the second main surface 14B parallel to the surface normal 38b, may coincide with a centroid, meaning a geometric center, of the main surface 14B. The tilting center 56 coincides with the surface centroid at least within a tolerance range of ±5 µm, ±2 µm, or ±1 µm. This allows a high precision of the deflection.

The above mentioned common configuration of support elements is particularly evident here. Thus, at least some of the column structures $24_1$ to $24_{12}$ may form a common structure, i.e., be connected to each other. For example, this may result in a circular structure, an annular structure or a polygon or the like, or also a part thereof.

Different spring elements may be formed along different axial extension directions between the respective column structure and the substrate 12. While this is obvious, for example, for the spring elements $22_1$ and $22_2$, an arrangement of two opposing spring elements, such as $22_1$ and $22_7$ of the MEMS 70 or $22_1$ and $22_2$ of the other MEMS may also be understood to be in opposite directions and therefore different from each other.

Optionally, the spring elements $22_1$ to $22_2$ may comprise a number of hinges 36 according to the configuration, the number of one hinge being selected merely by way of example and may also have a different value, for example 0, 2, 3, 4 or a higher value.

In other words, FIG. 7 shows a schematic view of a MEMS device with a movable useful area, twelve support elements, twelve flexible springs with hinge and twelve fixations from the bottom. The configuration enables space-saving integration of force generation into the support elements and/or spring elements according to another feature of the present invention. In contrast to known approaches with four actuators aligned along the x- and y-axis, this embodiment allows twelve actuators or support elements to be distributed in a circle. Thanks to this, the useful area can be rotated or tilted about any axis with constant high angle. If the support elements are driven magnetically, for example, as described in connection with FIG. 3a or 3b, arrangements according to FIGS. 4a and 4b can also be used, instead of or in addition to force generation, for capacitive detection of the position of the support elements in order to determine the position of the useful area based on this.

FIG. 8 illustrates a schematic flowchart of a method 800 according to an example embodiment that can be used for manufacturing a MEMS described herein, for example, the MEMS $10_1$, $10_2$, 20, $30_1$, $30_2$, $40_1$, $40_2$, 50, 60, and/or 70. A step 810 includes providing a substrate and an element movably suspended relative to the substrate, the element having a first main surface and an opposite second main surface. A step 820 includes arranging a first spring element between the substrate and a first column structure connected to the second main surface, and arranging a second spring element between the substrate and a second column structure connected to the second main surface, thereby movably suspending the movably suspended element 14.

According to an embodiment, the method 800 comprises a step of generating the first column structure and/or the second column structure by depositing a magnetic material, such as NdFeB, to obtain a magnetic column structure.

Referring again to FIG. 1a, a manufacturing method may be carried out, for example, such that the substrate 12 and the column structures 24, and optionally also the spring elements 22, are obtained from a common wafer and are formed, for example, by front-side etching and/or rear-side etching. The movable element 14 may then, for example, be arranged in the form of another wafer, for example by means of wafer bonding.

Embodiments allow a reduction of the lateral displacement, for example along the x-direction and/or y-direction by building the useful area on multiple columns, which also locally stabilizes the center of rotation in space. For a micromirror, for example, this can mean a small loss of light, which is advantageous. In addition, embodiments allow the leverage, which decreases with increasing distance between the columns, to be re-enforced by hinges on the springs. The hinges can have or provide soft structures or be a point on the springs where the driving force is concentrated so that deformation is provided. By using the columns below the useful area to generate force, the fill factor of the MEMS device can be high or even very high and dramatically increased compared to known solutions. By using magnets or capacitive electrodes at least as parts of the column structures and/or as hinges on the spring elements, the leverage can be increased and correspondingly large deflections can be obtained. With the stated capacitive components, it is possible to determine the position of the useful area. By using several non-orthogonal actuators/springs, the axes of rotation can be flexibly defined so that, for example, a large tilt angle can also be obtained around diagonals or intermediate angles, see MEMS 70.

According to an embodiment, a MEMS device comprises a useful area with one or several support elements and several flexible bending beams connected thereto, for example springs or actuators. The useful area is applied to the support element(s) such that the support elements and bending beams are located below the useful area. The bending beams are connected to the one or several support elements at one end and to a fixation at the other end. The connecting points of the flexible springs with the one or several support elements are outside the axis of rotation of the useful area.

The support elements are optionally used as actuators below the useful area for force generation or for active positioning of the useful area. Alternatively or additionally, the support structures below the useful area are configured such that the position of the center of rotation of the useful area is stabilized in space, for example by spacing apart the attachment locations of the spring elements. Alternatively or additionally, for force generation, the support elements can comprise micromagnets or electrode areas, so that an effective force can be applied to the support elements by means of counter components fixed on the carrier element, i.e. drive magnets/coils or electrodes, and the useful area can be actively moved. Alternatively or additionally, it is possible to use the combination of electrode areas and the corresponding counter components to capacitively detect the position and/or location of the useful area. Alternatively or additionally, it is not needed that support elements and the flexible springs are arranged orthogonally. In particular, they can also be arranged at any angle, in particular using a number >2, to realize a flexible axis of rotation of the useful plate mounted thereon. Alternatively or additionally, the flexible springs may comprise hinge elements. Such a hinge serves as the bending point of the bending beam. At the bending point, an almost discontinuous course of the bending line is made possible. This allows a leverage to be exploited in the force action.

Although some aspects have been described in the context of an apparatus, it is obvious that these aspects also represent a description of the corresponding method, such that a block or device of an apparatus also corresponds to a respective method step or a feature of a method step. Analogously, aspects described in the context of a method step also represent a description of a corresponding block or detail or feature of a corresponding apparatus.

While this invention has been described in terms of several advantageous embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] Patent specification EP 2670880 B1, V. Milanovic and K. Castelino, "MEMS device control with filtered voltage signal shaping."
[2] T. Reimer et al, "Temperature-stable NdFeB micromagnets with high-energy density compatible with CMOS back end of line technology", MRS Advances, No. 1, 2016.

The invention claimed is:

1. A MEMS (Microelectromechanical systems) comprising:
a substrate and an element movably suspended relative to the substrate, the element comprising a first main surface and an opposite second main surface;
a first spring element connected between the substrate and a first column structure connected to the second main surface, and a second spring element connected between the substrate and a second column structure connected to the second main surface.

2. The MEMS according to claim 1, wherein the movable element is tiltably supported about a tilting axis, and the first column structure and the second column structure are arranged symmetrically to the tilting axis.

3. The MEMS according to claim 1, wherein the tilting axis is arranged between the first column structure and the second column structure adjacent to the second main surface.

4. The MEMS according to claim 1, wherein the first main surface provides a useful area of the MEMS and the column structures are arranged facing away from the useful area; wherein the first spring element and the second spring element protrude beyond the useful area to an extent of at most 50%.

5. The MEMS according to claim 1, wherein the first spring element and the second spring element extend outwards from the first column structure and the second column structure with respect to the second main surface.

6. The MEMS according to claim 1, wherein the first spring element and the second spring element extend inwards from the first column structure and the second column structure with respect to the second main surface.

7. The MEMS according to claim 1, wherein the at least one first spring element and/or the second spring element comprises, along an axial path of the spring element, a hinge that provides stiffness reduction of the spring element along a direction parallel to a surface normal of the second main surface.

8. The MEMS according to claim 7, wherein the hinge is disposed in a transition area between the spring element and the column structure.

9. The MEMS according to claim 7, wherein the hinge is at least partially implemented by a local change of a spring material and/or by a local change of a spring structure.

10. The MEMS according to claim 7, wherein the hinge is at least partially implemented by locally thinning the spring element.

11. The MEMS according to claim 7, wherein the hinge is a first hinge (362) and is disposed adjacent to the column structure; wherein the spring element comprises a second hinge disposed adjacent to the substrate.

12. The MEMS according to claim 1, further comprising an actuator configured to generate an actuator force in an area of the first column structure and/or second column structure to deflect the movable element.

13. The MEMS according to claim 1, further comprising an actuator configured to generate an actuator force in an area of the first spring element and/or second spring element to deflect the movable element.

14. The MEMS according to claim 12, wherein the actuator is configured to provide at least one of a thermally induced actuator force, a piezoelectrically induced actuator force, an electrostatically induced actuator force, and a magnetically induced actuator force.

15. The MEMS according to claim 1, wherein a first electrode element of an actuator is arranged on the first column structure at an end facing away from the second main surface and a second electrode element of the actuator is arranged on an end of the second column structure facing away from the second main surface.

16. The MEMS according to claim 15, wherein the actuator device comprises a third electrode element arranged opposite to the first electrode element and without contact to the first column structure and the first spring element; and a fourth electrode element arranged opposite to the second electrode and without contact to the second column structure and the second spring element.

17. The MEMS according to claim 1, wherein the first column structure and/or the second column structure comprises a magnetic material and an actuator of the MEMS is adapted to generate a magnetic field adjacent to the magnetic material to effect movement of the movable element.

18. The MEMS according to claim 1, wherein the first spring element and/or the second spring element comprises a magnetic material and an actuator of the MEMS is configured to generate a magnetic field adjacent to the magnetic material to effect movement of the movable element.

19. The MEMS according to claim 1, wherein a first electrode element of an actuator is arranged on or in the first spring element and a second electrode element of the actuator is arranged on or in the second spring element.

20. The MEMS according to claim 1, further comprising at least a third spring element connected between the substrate and a third column structure connected to the second main surface;
   wherein the first column structure, the second column structure, and the third column structure are arranged in a rotationally symmetrical manner about a tilting center of the movable element.

21. The MEMS according to claim 20, further comprising fourth through twelfth column structures, wherein the first through twelfth column structures are arranged in a rotationally symmetrical manner about said tilting center and are each connected to the substrate via an associated spring element.

22. The MEMS according to claim 1, wherein the first spring element is formed in a straight manner along a first axial extension direction between the first column structure and the substrate; and the second spring element is formed in a straight manner along a second axial extension direction between the second column structure and the substrate.

23. The MEMS according to claim 1, further comprising a sensor configured to detect a position and/or orientation of the movable element.

24. The MEMS according to claim 23, further comprising a control configured to regulate an actuator for deflecting the movable element from a resting position based on the detected position and/or orientation of the movable element.

25. The MEMS according to claim 1, wherein a first attachment area where the first spring element is arranged on the substrate is spaced apart from a second attachment area where the second spring element is attached to the substrate.

26. The MEMS according to claim 1, wherein the spring elements provide leverage for movement of the movable element effected by an actuator.

27. The MEMS according to claim 1, wherein a tilting center about which the movable element is tiltable, when projected into the second main surface and parallel to a surface normal of the second main surface, coincides with a centroid of the second main surface within a tolerance range of 5 µm.

28. The MEMS according to claim 1, wherein the first spring element and the second spring element extend in a plane parallel to the second main surface in a load-free state of the MEMS.

29. The MEMS according to claim 1, wherein the first column structure and the second column structure are arranged perpendicular to the second main surface.

30. The MEMS according to claim 1, wherein the movable element is a mirror element and the first main surface is formed mirror-like.

31. The MEMS according to claim 1, wherein the first main surface and the second main surface are connected by a side surface of the movable element.

* * * * *